US009141005B2

(12) United States Patent
Laurent et al.

(10) Patent No.: US 9,141,005 B2
(45) Date of Patent: Sep. 22, 2015

(54) TEMPERATURE SENSING PROBE, BURL PLATE, LITHOGRAPHIC APPARATUS AND METHOD

(75) Inventors: Thibault Simon Mathieu Laurent, Eindhoven (NL); Gerardus Adrianus Antonius Maria Kusters, Eindhoven (NL); Johan Gertrudis Cornelis Kunnen, Weert (NL); Sander Catharina Reinier Derks, Budel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 562 days.

(21) Appl. No.: 13/488,111

(22) Filed: Jun. 4, 2012

(65) Prior Publication Data
US 2012/0307216 A1    Dec. 6, 2012

Related U.S. Application Data

(60) Provisional application No. 61/493,796, filed on Jun. 6, 2011.

(51) Int. Cl.
| | | |
|---|---|---|
| G03B 27/52 | (2006.01) | |
| G03B 27/42 | (2006.01) | |
| G03F 7/20 | (2006.01) | |
| G01K 13/00 | (2006.01) | |

(52) U.S. Cl.
CPC ............ G03F 7/70875 (2013.01); G01K 13/00 (2013.01); G03F 7/707 (2013.01)

(58) Field of Classification Search
CPC .... G03F 7/707; G03F 7/7095; G03F 7/70875
USPC ................................................ 355/30, 53, 72
See application file for complete search history.

(56) References Cited

U.S. PATENT DOCUMENTS

| | | | |
|---|---|---|---|
| 4,509,852 A | 4/1985 | Tabarelli et al. | |
| 6,086,680 A | 7/2000 | Foster et al. | |
| 6,921,724 B2 | 7/2005 | Kamp et al. | |
| 7,196,768 B2 * | 3/2007 | Ottens et al. | 355/30 |
| 8,502,960 B2 | 8/2013 | Brinkhof et al. | |
| 8,564,763 B2 * | 10/2013 | Jacobs et al. | 355/72 |
| 2003/0219062 A1 | 11/2003 | Egidio | |
| 2004/0136494 A1 | 7/2004 | Lof et al. | |
| 2004/0207824 A1 | 10/2004 | Lof et al. | |
| 2006/0087637 A1 | 4/2006 | Ottens et al. | |
| 2006/0119809 A1 | 6/2006 | Verhagen et al. | |
| 2008/0137055 A1 | 6/2008 | Hennus et al. | |
| 2009/0279061 A1 | 11/2009 | Jacobs et al. | |
| 2011/0007288 A1 | 1/2011 | Brinkhof et al. | |
| 2011/0075118 A1 | 3/2011 | Jacobs et al. | |
| 2011/0222032 A1* | 9/2011 | Ten Kate et al. | 355/30 |
| 2011/0222033 A1 | 9/2011 | Ten Kate et al. | |

(Continued)

FOREIGN PATENT DOCUMENTS

| | | |
|---|---|---|
| EP | 0 915 499 | 5/1999 |
| EP | 1 303 167 | 4/2003 |

(Continued)

*Primary Examiner* — Hung Henry Nguyen
(74) *Attorney, Agent, or Firm* — Pillsbury Winthrop Shaw Pittman LLP (57) ABSTRACT

A temperature sensing probe including a temperature sensor in an elongate housing wherein the elongate housing of the probe is elongate in a first direction and the elongate housing is comprised of a material which has a thermal conductivity of at least 500 W/mK at 20° C. in at least one direction.

20 Claims, 4 Drawing Sheets

(56) References Cited

U.S. PATENT DOCUMENTS

2011/0232878 A1 9/2011 Jacobs et al.
2012/0013865 A1 1/2012 Laurent et al.

FOREIGN PATENT DOCUMENTS

| | | |
|---|---|---|
| EP | 1 420 300 | 5/2004 |
| JP | H03-27522 | 2/1991 |
| JP | 2001-522138 | 11/2001 |
| JP | 2002-110524 | 4/2002 |
| JP | 2010-054491 | 3/2010 |
| JP | 2010-141355 | 6/2010 |
| JP | 2011-023716 | 2/2011 |
| JP | 2011-071513 | 4/2011 |
| WO | 99/49504 | 9/1999 |
| WO | 2005/064405 | 7/2005 |

* cited by examiner

Fig. 1

-- PRIOR ART --

Fig. 2

-- PRIOR ART --

Fig. 3

-- PRIOR ART --

-- PRIOR ART --

TEMPERATURE SENSING PROBE, BURL PLATE, LITHOGRAPHIC APPARATUS AND METHOD

This application claims priority and benefit under 35 U.S.C. §119(e) to U.S. Provisional Patent Application No. 61/493,796, entitled "Temperature Sensing Probe, Burl Plate, Lithographic Apparatus and Method", filed on Jun. 6, 2011. The content of that application is incorporated herein in its entirety by reference.

FIELD

The present invention relates to a temperature sensing probe, a burl plate, a lithographic apparatus and a method of compensating for local heat load variation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example U.S. Pat. No. 4,509,852) means that there is a large body of liquid that must be accelerated during a scanning exposure. This requires additional or more powerful motors and turbulence in the liquid may lead to undesirable and unpredictable effects.

Figure 2:
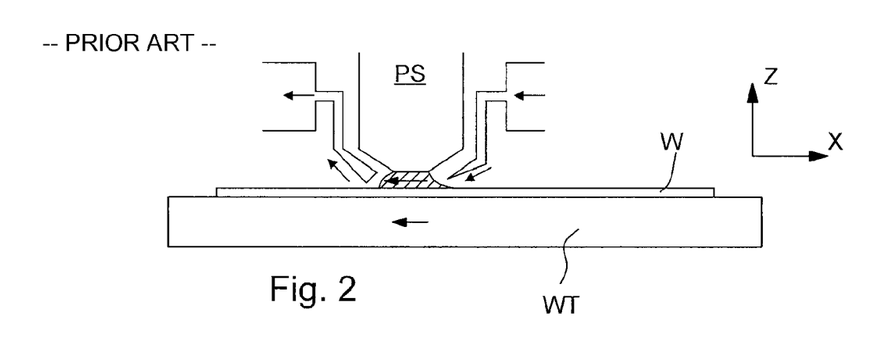
FIGS. 2 and 3 depict a liquid supply system for use in a lithographic projection apparatus.
Figure 3:
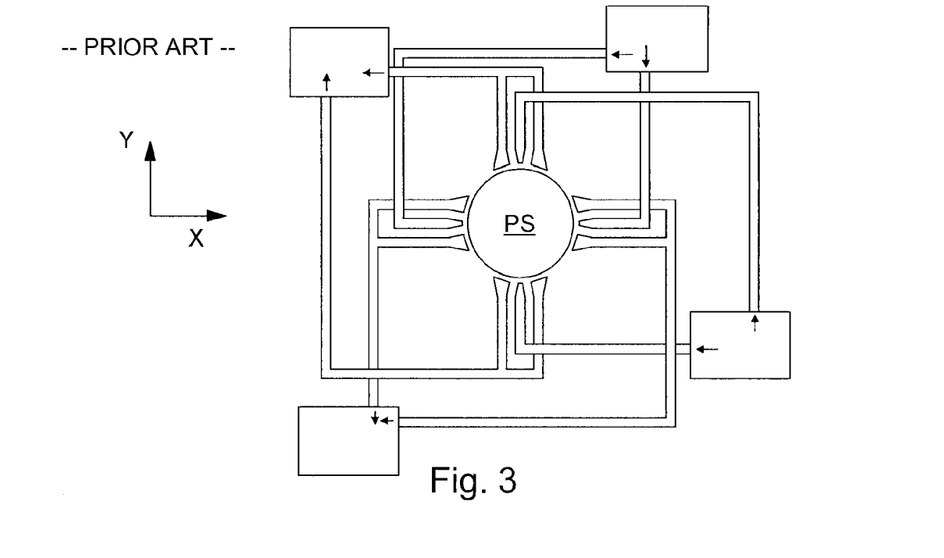

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
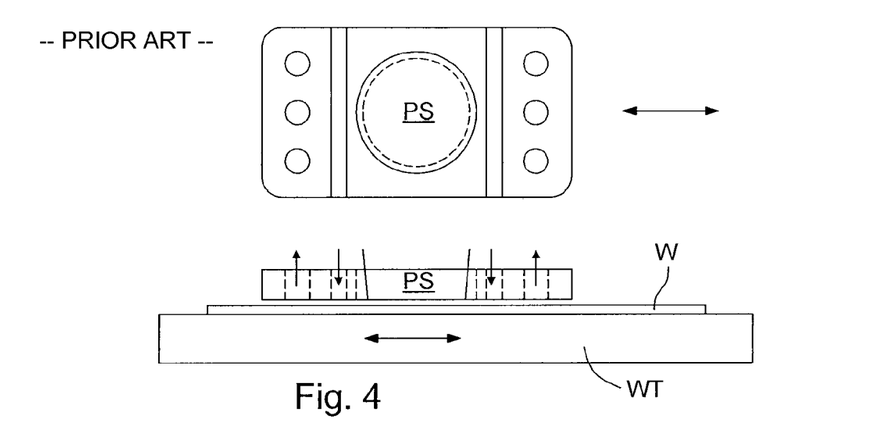
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

SUMMARY

Because of the presence of liquid on the substrate in an immersion lithographic apparatus, an evaporational heat load can result on one or more components which come into contact with immersion liquid (e.g. the substrate and/or substrate table). Such a heat load can lead to thermal expansion and/or contraction. Such thermal expansion and/or contraction can lead to imaging errors, in particular overlay errors.

A thermal gradient which can be set up due to the evaporational heat load can make control of a heater problematic.

It is desirable, for example, to provide a temperature sensing probe which can be used in circumstances where a temperature gradient exists. The incorporation of such a temperature sensing probe into a burl plate and/or substrate table and/or a lithographic apparatus is desirable.

In an aspect of the invention, there is provided a temperature sensing probe, comprising: a temperature sensor in an elongate housing wherein the elongate housing is elongate in a first direction and comprised of a material with a thermal conductivity of at least 100 W/mK at 20° C. in at least one direction.

It is desirable, for example, to provide an apparatus in which the occurrence of thermal expansion/contraction effects are reduced. In particular it is desirable to provide a system configured to reduce thermal expansion/contraction effects in an immersion system which uses a supply system which provides immersion fluid to a localized area of the substrate and/or substrate table.

In an aspect of the invention, there is provided a burl plate comprising: a main body comprising a substrate supporting surface; a heater on a surface of the main body opposite the substrate supporting surface; and a temperature sensor configured to measure an average temperature of parts of the main body between the substrate supporting surface and the surface opposite the substrate supporting surface.

In an aspect of the invention, there is provided a method of compensating for a local heat load in an immersion lithographic projection apparatus, the method comprising controlling a heater based on a signal indicative of an average temperature of first and second parts of a burl plate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
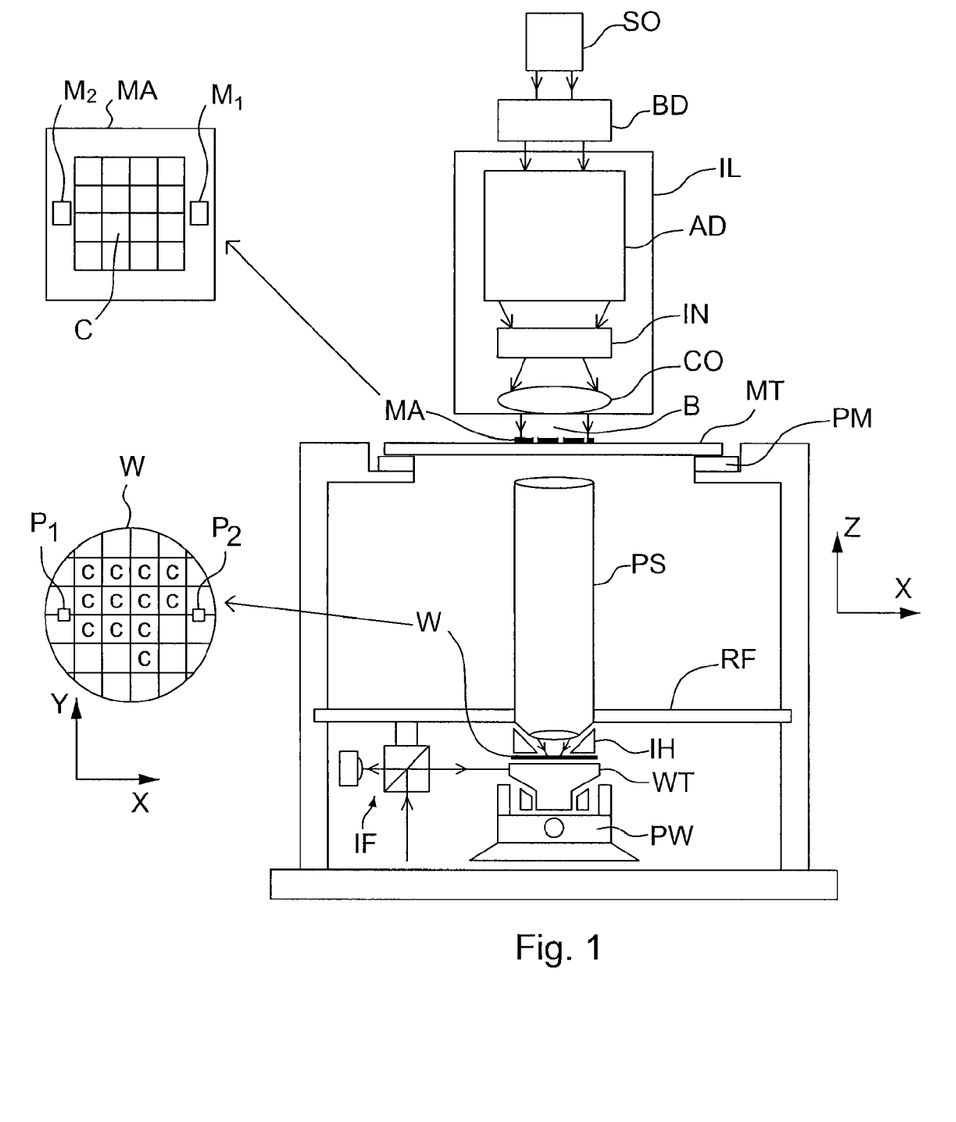
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system PS while the substrate W moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
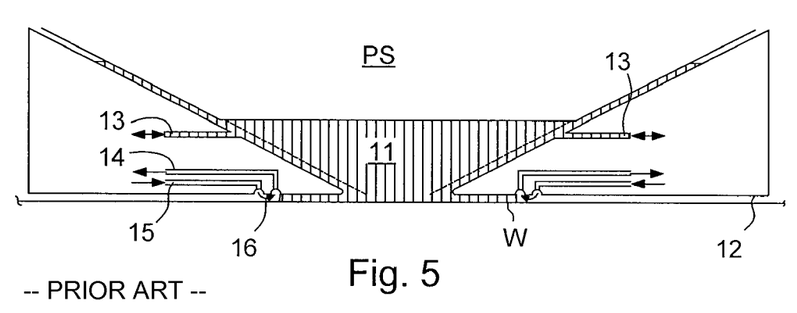
FIG. 5 depicts, in cross-section, a barrier member which may be used in an embodiment of the present invention as a liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a barrier member 12, IH. The barrier member extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The barrier member 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the barrier member 12 positioned below and surrounding the final element of the projection system PS. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

Other arrangements are possible and, as will be clear from the description below, an embodiment of the present invention may be use with any type of localized liquid supply system. An embodiment of the invention is particularly relevant to use with any localized liquid supply systems as the liquid supply system.

Local undesirable evaporation of liquid can occur on a substrate in an immersion lithographic apparatus. This can in turn lead to localized cooling. Localized cooling is undesirable because it may lead to thermal contraction of the substrate table and thereby to possible overlay errors.

One way in which this phenomenon may be dealt with is to provide a channel for a heat transfer fluid in the substrate table WT. The temperature of the substrate table can be maintained substantially constant in this way. Additionally, as disclosed in United States patent publication no. US 2008-0137055, a further heater may be used to heat in the vicinity of a liquid inlet in the substrate table around the periphery of the substrate W. Therefore the extra thermal load which is generated at that point may be compensated for by the use of that further heater.

Figure 6:
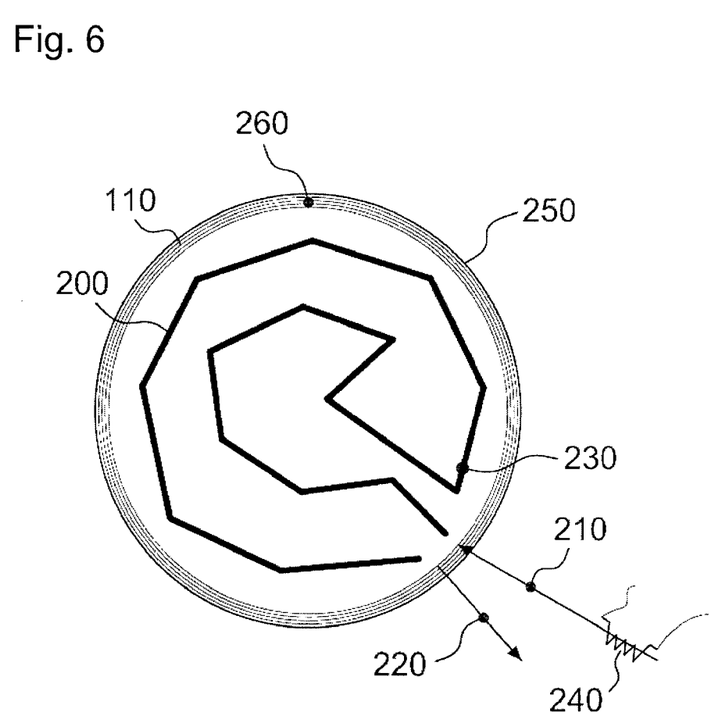
FIG. 6 illustrates, in plan, a central section of a substrate table.

FIG. 6 illustrates one such arrangement. FIG. 6 is a plan view of the substrate support area of a substrate table WT. The inlet 110 is indicated. A central channel 200 for heat transfer fluid is provided. The central channel 200 follows a path under the position of the substrate W. The path of the central channel 200 is such that an even heat transfer can be applied by passing a heat transfer fluid through the channel 200. The temperature of the heat transfer fluid entering the channel 200 is detected by a first temperature sensor 210. The temperature of heat transfer fluid exiting the channel 200 is detected by a second temperature sensor 220. A third temperature sensor 230 may be provided in the channel 200 to detect the temperature at a local point. A controller can be provided with data from the temperature sensors 210, 220, 230 and can control the temperature of the heat transfer fluid using a heater and/or cooler 240 which is used to heat and/or cool heat transfer fluid prior to the heat transfer fluid entering the channel 200.

In order to deal with the excessive cooling which can be generated by or in the inlet around the periphery of the substrate, one or more heating elements 250 (e.g. six) may be provided. The heating element 250 may be a single heating element which is adjacent the inlet and extends around the periphery (e.g., circumference) of the inlet.

A fourth temperature sensor 260 is provided. The fourth temperature sensor 260 is provided in the vicinity of the inlet.

A controller can use the information obtained from the fourth temperature sensor 260 to control the power applied to the heating element 250.

Although the system illustrated in FIG. 6 does alleviate some difficulties, particularly when a localized area liquid supply system is used, the cooling around the periphery of the inlet 110 may not necessarily be uniform. Therefore the position of the fourth temperature sensor 260 is significant. If the fourth temperature sensor 260 is in a position which has experienced a large amount of local cooling, then although that cooling may be compensated, other areas of the inlet 110 may be heated too much. The difficulty with sensor 260 means that it may be better to control the heating element 250 based on the temperature difference between the second and third temperature sensors 220 and 230. The controller uses this difference as a measure of the thermal load on the substrate table edge. If on a part of the total periphery of the substrate table a thermal load is applied, the balancing heat load is applied over the total periphery. As a result the heating element undercompensates the loaded area and disturbs the unloaded area. If, for instance, 1 W is over $\frac{1}{3}^{rd}$ of the substrate table edge, this is compensated with 1 W over the total edge. So, only 0.33 W of that localized load is compensated, the other 0.66 W is disturbing the rest of the edge. Even by the provision of further temperature sensors around the inlet 110, this problem may not be alleviated.

The solution of FIG. 6 may have the following shortcomings: 1) The heater-sensor combination reaction time may be too slow (long time constant). The heaters and sensors may be glued to the substrate table WT resulting in relatively high contact resistances. 2) The heaters and sensors are only applied at the substrate table edge and not to its core (central portion), which provides a partial solution. 3) Liquid (e.g., water) conditioning may be limited to a maximum flow which may lead to a non-uniform temperature distribution. Because the liquid channel is small in cross-section and rather long the flow resistance is high. For high flows the pressure drop may become large, leading to non-uniform mechanical deformation of the substrate table itself. High flows lead to high velocities and high dynamic forces, which may lead to uncorrectable disturbance forces. Any flow (not only the maximum flow) leads to a non-uniform temperature distribution. The liquid cools down from inlet to outlet. This temperature difference results in non-uniformity. The higher the flow, the lower the dT. 4) Liquid conditioning can lead to uncorrectable dynamic disturbances because of pressure pulses. 5) Liquid conditioning involves a 'thick' (e.g., 10 mm), and therefore heavy, substrate table WT causing scan-up-scan-down problems.

Figure 7:
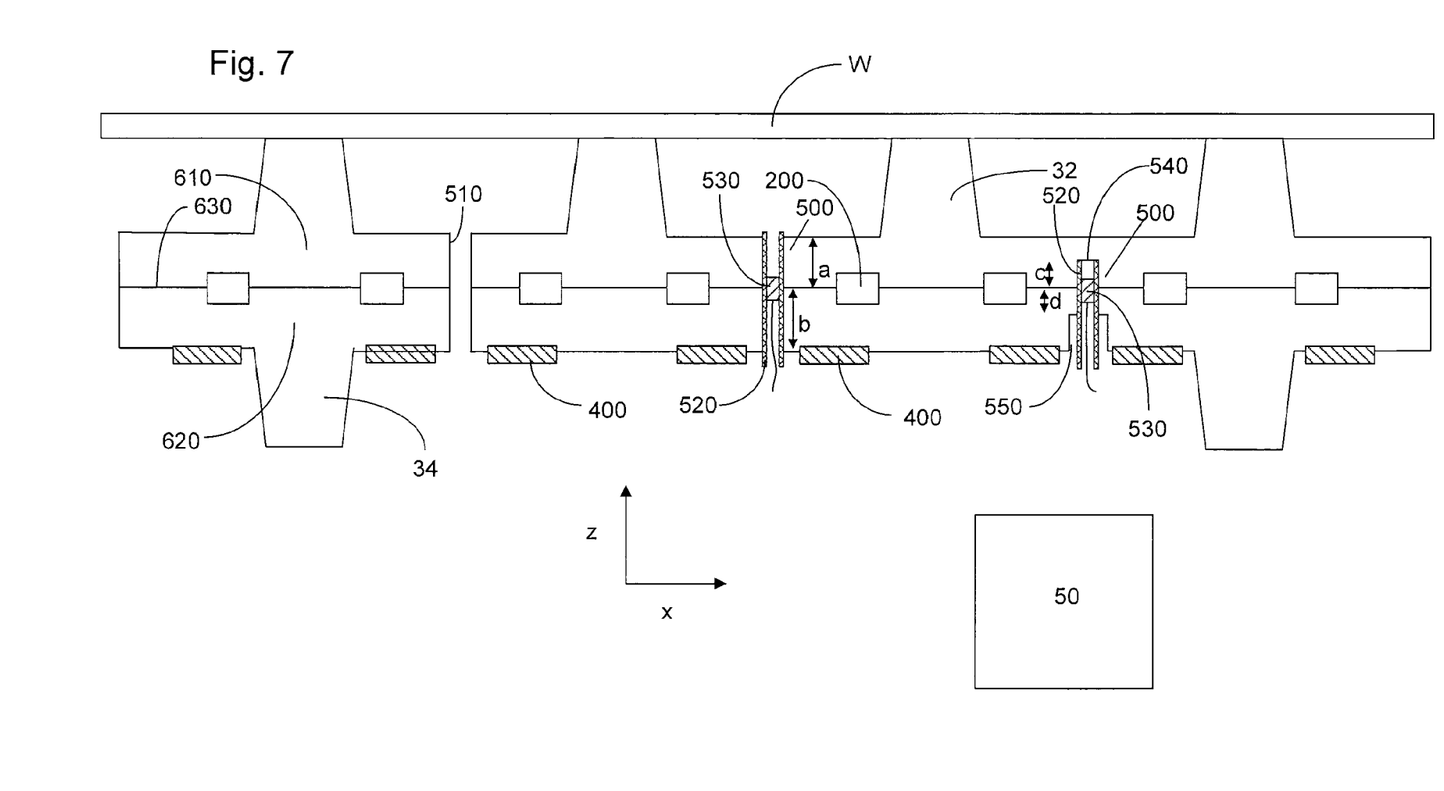
FIG. 7 illustrates, in cross-section, a burl plate showing the location of heaters and temperature sensing probes.

A burl plate 600 of an embodiment is illustrated in FIG. 7. The burl plate 600 is comprised of a plate with projections on an upper substrate supporting surface and on a lower surface opposite the substrate supporting surface. The projections on the upper surface are burls 32 on which the substrate W, in use, is supported. The burls 34 on the underside are for supporting the burl plate 600 on a surface of the substrate table WT.

In FIG. 7 at least one heater 400 is on the surface opposite the substrate supporting surface of the burl plate 600, formed between the burls 34. The heater 400 is on a downwardly facing surface of the burl plate 600. This is because there is more space between the burls 34 on the downwardly facing surface of the burl plate 600 than between the burls 32 on the opposite upwardly facing surface of a burl plate 600 which supports the substrate.

In one embodiment the heater(s) 400 is/are formed as a thin film. However, other forms of heater 400 may be used. The heater 400 may be attached directly to the surface without the use of an adhesive such as glue, solder, etc. Thus the heater 400 is directly bonded to the surface, for example deposited on the surface. In one embodiment the heater 400 is formed of platinum. If the burl plate 600 is made of a conductive material (such as SiSiC), an insulating layer and/or a bonding layer may be deposited before the heater 400 is deposited. It may be necessary additionally to coat the heater 400 (with another dielectric layer) once it has been deposited in order to ensure electrical isolation of the heater 400 and protection from moist gas which might otherwise create a short circuit. In an embodiment an additional insulating layer is provided over the heater 400 so heat goes into the surface. This results in more directing of heat into the body (e.g. burl plate 600).

Normally the thin films have 4 layers in total. On top of the substrate table (e.g. burl plate 600) there is a bonding layer, then an isolating dielectric layer, then the conducting (e.g. metal, platinum, etc.) layer and then again a dielectric layer on top to avoid short-circuiting. To avoid electro-magnetic interference of the lines there may be 2 extra shielding layers. The heaters and/or temperature sensors are thin, say below 100 μm, in an embodiment below 10 μm or even 1 μm thick.

Because the heater 400 is bonded directly to the surface, heat is conducted to/from the heater 400 to the material behind the surface quickly. Because the surface to which the heater 400 is applied is the burl plate 600, the transfer of heat to/from the substrate W is extremely quick because of their proximity to the substrate W.

An embodiment of the present invention may be used on its own or in combination with an edge heater 250 as illustrated in FIG. 6 and/or a channel 200 adjacent the substrate supporting area for the passage of a thermal conditioning fluid therethrough such as illustrated in FIG. 6. Additionally, the heaters 400 may be employed in combination with a substrate table WT conditioned by a two-phase fluid. In such an embodiment a chamber is provided in the body of the substrate table WT which is filled with a fluid in gaseous and/or liquid phases. Such a substrate table conditioning system is described in United States patent application no. US 2011-0232878 and United States patent application publication no. US 2011-0075118, both hereby incorporated in their entirety by reference.

The substrate table edge heater 250 control loop may have a fast response time (of the order of a few seconds) because the sensors and heater are placed very close to the heat load. The response time for the channel 200 is quite slow in comparison. This is because any evaporational load coming from liquid on the substrate W must first be transferred from the substrate W to the burl plate 600 (which is typically made of SiSiC), then from the burl plate 600 to the fluid in the channel 200 and then to any sensor with which the fluid is in contact. Moreover, the response time of the heater and/or cooler for the fluid in the channel 200 is quite slow and the heater and/or cooler is usually distal from the channels 200 so that it takes time for the heat transfer fluid to reach the channel 200. However, the heat transfer control via the channel 200 is advantageous because it can compensate the exact amount of load at the location it is needed; no matter where on the burl plate 600 the load is applied, the load will end up at the channel 200, be detected and compensated. Additionally, the channel 200 has an advantage that it may compensate both for cooling and heating loads, which is not possible with a heater, which can only compensate for cooling loads.

To overcome a drawback of a slow control loop of the channel 200, a temperature compensating system with a faster feedback is desirable. This may be achieved by directly sensing the temperature of the main body of the burl plate 600 and applying heat directly to the main body of the burl plate 600. It would be best to apply the heat to the surface of the main body of the burl plate 600 which faces the substrate. However, there is little space between the top burls 32 of the burl plate and positioning a heater and sensor between the burls 32 and the main body 600 and the substrate W is problematic. Therefore, the heater 400 is placed on the surface of the burl plate opposite to the substrate supporting surface on which the substrate W is supported (i.e. on the bottom surface as illustrated in FIG. 7). An advantage is that the burl 34 pitch is greater on the surface opposite the substrate supporting surface.

A difficulty with the positioning of the heaters 400 on the surface opposite to the substrate supporting surface is the presence of a temperature gradient through the thickness of the burl plate 600 (in the Z direction). For the case of the main body of the burl plate 600 being a single piece, the temperature gradient is not so high. However, for the more usual case where the main body is comprised of a first part 610 and a second part 620 joined along a plane 630, the temperature gradient between the substrate supporting surface and the surface opposite the substrate supporting surface on which the heaters 400 are placed, can be quite large. The first and second parts 610, 620 may be joined by glue or other methods. In an embodiment the two parts 610, 620 are joined by a glass bond (melted glass).

The temperature gradient in the first part 610 is low and temperature gradient in the second part 620 is low; the temperature gradient arises because of the low thermal conductivity of glue joining the first and second parts 610, 620 in plane 630 and the majority of the thermal gradient is present in that glue.

Such a gradient may not be problematic in terms of burl plate 600 deformation (and thereby overlay performance) so long as the average temperature of the burl plate 600 is maintained within a certain parameter. This is because the first part 610 is hotter than the second part 620, resulting in shrinking of the first part 610 relative to the second part 620. However, the relative shrinking of the first part 610 and relative expanding of the second part 620 compensate each other.

If a sensor is placed too near to the substrate supporting surface, the sensor measures a temperature which is too cold for good control of the heater 400. In these circumstances the heater 400 will overheat the burl plate 600. This has a positive effect on Z deformation (because of a bi-metallic effect (resulting in bending of the burl plate 600 due to different amounts of expansion/contraction of the upper and lower parts 610, 620 which are at different temperatures) in which the burl plate 600 would counteract the bi-metallic effect between the substrate W and the burl plate 600 (resulting due to different thermal expansions/contractions between the top of the burl plate 600 and the substrate W)). However, the deformation of the substrate W does not change significantly (because the substrate temperature does not change significantly) while the burl plate 600 deformation dramatically increases leading to an unacceptable level of deformation in the XY direction.

If a sensor is placed too far away from the substrate supporting surface (e.g. on the surface opposite the substrate supporting surface), the heater 400 will not compensate enough for a cooling load leading to the temperature of the burl plate 600 being too low. Because the substrate W would be colder, deformation effects would thus be increased, leading to poorer overlay performance.

Additionally, if a layer of glue between a temperature sensor and the main body of the burl plate 600 is uneven or the sensor is tilted or a gas bubble exists in the layer of glue, the temperature measured will be inaccurate.

It is desirable to place one or more temperature sensors on which control of the heater 400 is performed so that it measures the average temperature of the burl plate 600 between the substrate supporting surface and the surface opposite the substrate supporting surface. However, accurate placing of a sensor can be difficult.

One or more of these or other difficulties are addressed in the temperature sensing probe 500 illustrated in FIG. 7.

The temperature sensing probe 500 is capable of sensing an average temperature of the two parts 610, 620. The temperature sensing probe 500 has an advantage that it is not sensitive with respect to the exact positioning of a temperature sensor 530 relative to the two parts of which the average temperature is to be sensed. Additionally, the temperature sensing probe is not sensitive to its positioning within a hole 510 which is formed in the two parts 610, 620 the average temperature of which is desired to be measured. The distance the hole 510 extends in the first part is substantially equal to the distance the hole extends in the second part (assuming a constant cross-sectional periphery of the temperature sensing probe 500).

FIG. 7 shows two exemplary embodiments with use of a through-hole 510 in the center and a blind-hole 540 on the right-hand side. In these embodiments distances a and b should be equal in the center embodiment (assuming the temperature at plane 630 is to be measured) and distances c and d should be substantially equal in the right-hand embodiment. The temperature sensing probe 500 measures the average temperature of the surface of the hole with which the temperature sensing probe 500 is in contact.

The way temperature sensing probe 500 allows for the greater tolerance is by use of a housing 520, particularly an elongate housing. The housing 520 may have any cross-sectional shape. The housing may be hollow. The housing may be a pipe. The housing is made of a high thermally conductive material. The material is particularly conductive in the elongate direction (a first direction) at typical operating temperatures of the apparatus (for example 20° C.). In one embodiment the thermal conductivity of the material of the elongate housing is at least 300, 400 or 500 W/mK at 20° C. This compares with a thermal conductivity of a typical material of the main body of the burl plate 600 (e.g. SiSiC) of between 100 and 200 W/mK. This means that the temperature of the elongate housing reaches an average temperature very quickly compared to the burl plate. Having a higher thermal conductivity results in faster equalization of temperature in the elongate housing compared to the burl plate 600.

Some applications (such as measuring average temperatures of a liquid supply system) where the body whose temperature is being measured has a low thermal conductivity (e.g. stainless steel has a thermal conductivity of 15 W/mK) benefit from an elongate housing with a thermal conductivity of above 100 or 150 or 200 W/mK.

Some metals have a conductivity of up to about a maximum of 430 W/mK (for silver). Other metals with a high thermal conductivity include copper (400 W/mK) and gold (300 W/mK). Having a thermal conductivity of over 100 W/mK at 20° C. for the elongate housing means that heat distributes in the elongate housing much faster than even in the material of the body (e.g. stainless steel).

A thermal conductivity of over 500 W/mK is most desired as this makes the sensing probe 500 capable of measuring an average temperature most accurately (even for a burl plate 600 made of a single part of SiSiC). A material such as graphite has a thermal conductivity of nearly 2000 W/mK in a direction parallel to the crystal layers. Therefore, a material of which the elongate housing 510 may be made is graphite, such as pyrolytic graphite.

A maximum achievable thermal conductivity may be in the region of 2500 W/mK or of 2000 W/mK at 20° C.

A temperature sensor 530 is glued into position in the elongate housing 520. The temperature sensor 530 is desirably glued in a position such that it is close to the position at which the temperature should be measured. However, this may not be essential because the high conductivity of the elongate housing 520 ensures that heat is conducted quickly in the elongate direction. Therefore, the elongate housing 520 has a substantially homogenous temperature. Desirably the glue is a high thermally conductive glue such as an epoxy glue.

The temperature of the sensor housing 520 (and thereby the temperature measured by the temperature sensor 530) is only dependent upon the surface ratio in contact with the first part 610 and the second part 620 of the main body of the burl plate 600 (and on glue layer thickness between the elongate housing and the burl plate 600). If the surfaces in contact are equal, the measured temperature is an exact average of the temperature of the first part 610 and the second part 620.

The temperature sensor 530 is glued in the elongate housing 520. Because the temperature of the elongate housing 520 is homogenous, the tolerance requirements as regards glue thickness between the temperature sensor 530 and housing 520 are not that stringent.

The glue thickness between the housing 520 and the main body of the burl plate 600 should be as homogenous as possible. A minimum layer thickness can be achieved by adding particles of a uniform size to the glue. This helps ensure a minimum thickness of glue between elongate housing 520 and the main body of the burl plate 600. The particles may be shaped substantially as spheres.

Because the temperature sensing probe 500 is much longer than the length of the temperature sensor 530 itself, there is a lower risk of having a tilted sensor which can lead to inaccurate temperature measurement.

The temperature sensor 530 may be of any type. In an embodiment the temperature sensor is a negative temperature coefficient sensor (NTC sensor). In an embodiment the temperature sensor is a positive temperature coefficient sensor. The temperature sensor may have a diameter of approximately 0.5 mm and a length of 4 to 5 mm.

In a central embodiment of FIG. 7 a through hole 510 is present through the main body of the burl plate 600. The temperature sensing probe 500 is positioned in the through hole 510. So long as the thickness a of the top part 610 is substantially equal to the thickness b of the bottom part 620, the surfaces of the top part 610 and the bottom part 620 with which the housing 520 is in contact will be substantially equal. As a result, the temperature sensor 530 will measure an average temperature of the top and bottom parts 610, 620. This geometry can be easily measured and manufactured.

Another embodiment is illustrated in the right-hand side of FIG. 7. Here a blind hole 540 is used (meaning a hole which does not penetrate all the way through the main body). Here the distance c the through hole penetrates into the first part 610 and the distance d the hole travels through the second part 620 is chosen so that the contact areas are substantially equal (taking into account the top surface of the temperature sensing probe 500 in contact with the wall at the end of the hole 540). In order to help ensure that the dimension d is substantially equal to dimension c, a recess 550 may be formed in the surface opposite to the substrate supporting surface.

An advantage of the blind hole embodiment is that the temperature sensing probe 500 may be positioned under or in proximity to a burl 32 without the burl needing to be removed.

In both the central and right-hand embodiments of FIG. 7 the amount of surface of the housing 520 exposed to the environment (e.g. gas) is not significant. This is because the thermal conductivity of gas is much lower than that of the main body. As a result, contact of the housing 520 with gas does not significantly affect temperature readings.

In one embodiment the hole 510, 540 is perpendicular to the plane 630.

In one embodiment the burl plate 600 comprise one temperature sensing probe and one heater 400. A controller 50 controls the power applied to the heater 400 based on the reading it receives from the temperature sensing probe 500.

In an embodiment the burl plate 600 comprises a plurality of heaters 400. The plurality of heaters are individually controllable. In an embodiment the burl plate 600 comprises a plurality of temperature sensing probes 500. In an embodiment a temperature sensing probe 500 is associated with each heater 400 and measures a temperature local to the heater 400. The controller 50 controls the power applied to the heater 400 according to the reading from the associated temperature sensing probe 500.

The temperature sensing probe 500 may be used at other locations in a lithographic apparatus. In particular, the temperature sensing probe may be used where an average temperature between two components or an average temperature over a distance of a component is desired to be measured. This temperature sensing probe is particularly advantageous in measuring an average temperature where a temperature gradient is present. One position where a temperature gradient may be present is on the top surface of a liquid supply system. Such a liquid supply system can receive cooling loads due to the evaporation of liquid and this may result in a temperature gradient in the XY plane. A temperature sensing probe as described above may be used to measure an average temperature along a direction.

Although one or more temperature sensing probe 500 has been described above with reference to one or more heaters, an embodiment may have one or more cooling devices in addition or as an alternative for use in association with the temperature sensing probe.

Although an embodiment of the present invention has been described above with reference to an immersion lithographic apparatus, this need not necessarily be the case. Other types of lithographic apparatus may suffer from uneven cooling (or heating). For example, in an EUV apparatus (extreme ultraviolet apparatus) heating due to the impingement of the projection beam can occur. This can give a localized heating to the substrate rather in the same way as the passage of the edge of substrate under the localized liquid supply system can give a cooling effect. If the heat transfer fluid in the channel 200 is given a small negative temperature offset with respect to the desired temperature in a normal operating condition, all the heaters can be on to obtain the desired temperature. A local cooling load can then be applied by switching a heater off. In this circumstance it may be that the localization of the heaters only at the edge of the substrate is too limited and that heaters may be additionally or alternatively be placed at different radial distances from the center of the substrate supporting area. However, the same principles as described above apply in this case also.

Therefore, as can be seen, an embodiment of the present invention can be implemented in many types of lithographic apparatus. For example, an embodiment of the invention may be implemented in an I-line lithographic apparatus.

In an embodiment, there is provided a temperature sensing probe, comprising: a temperature sensor in an elongate housing wherein the elongate housing is elongate in a first direction and comprised of a material with a thermal conductivity of at least 100 W/mK at 20° C. in at least one direction.

In an embodiment, the at least one direction is the first direction. In an embodiment, the temperature sensor is substantially at a center of the elongate housing in the first direction. In an embodiment, the elongate housing is comprised of graphite. In an embodiment, the graphite is pyrolytic graphite. In an embodiment, the temperature sensor is a negative temperature coefficient sensor. In an embodiment, the temperature sensor is held in the elongate housing with glue. In an embodiment, the thermal conductivity is at least 150, 200, 300, 400 or 500 W/mK.

In an embodiment, there is provided a burl plate for a lithographic apparatus, the burl plate comprising a main body and a temperature sensing probe as described herein.

In an embodiment, the sensor is inserted in a hole in the main body to measure an average temperature of the surface of the hole. In an embodiment, the main body comprises two parts and the hole is elongate in a substantially perpendicular direction to a plane in which the two parts of the main body are joined. In an embodiment, the distance the hole extends through a first part of the two parts is substantially equal to the distance the hole extends through a second part of the two parts. In an embodiment, the hole is a blind hole. In an embodiment, the temperature sensing probe is glued in the hole. In an embodiment, the glue comprises particles of a uniform size to ensure a minimum thickness of glue between the elongate housing and the main body. In an embodiment, the burl plate further comprises a heater on a surface of the main body opposite to a surface on which a substrate is to be positioned, in use. In an embodiment, the burl plate comprises at least one further heater on the surface. In an embodiment, the burl plate comprises a further temperature sensing probe as described herein, each of the heaters having an associated temperature sensing probe. In an embodiment, the burl plate further comprises a controller configured to control the heater(s) depending upon a temperature sensed by the temperature sensing probe.

In an embodiment, there is provided a burl plate comprising: a main body comprising a substrate supporting surface; a heater on a surface of the main body opposite the substrate supporting surface; and a temperature sensor configured to measure an average temperature of parts of the main body between the substrate supporting surface and the surface opposite the substrate supporting surface. In an embodiment, the temperature sensor is part of a temperature sensing probe as described herein. In an embodiment, the burl plate comprises a fluid channel in the main body for the passage therethrough of a temperature conditioning fluid.

In an embodiment, there is provided a lithographic apparatus comprising a burl plate as described herein.

In an embodiment, there is provided a lithographic apparatus comprising a temperature sensing probe as described herein.

In an embodiment, there is provided a method of compensating for a local heat load in an immersion lithographic projection apparatus, the method comprising controlling a heater based on a signal indicative of an average temperature of first and second parts of a burl plate.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A burl plate for a lithographic apparatus, the burl plate comprising:
   a main body comprising an object supporting surface; and
   a temperature sensing probe comprising a temperature sensor in an elongate housing, wherein the elongate housing is elongate in a first direction transverse to the object supporting surface, contacts the main body along at least part of its length, and is comprised of a material with a thermal conductivity of at least 100 W/mK at 20° C. in at least one direction.

2. The burl plate of claim 1, wherein the sensor is inserted in a hole in the main body to measure an average temperature of the surface of the hole.

3. The burl plate of claim 2, wherein the main body comprises two parts and the hole is elongate in a substantially perpendicular direction to a plane in which the two parts of the main body are joined.

4. The burl plate of claim 3, wherein the distance the hole extends through a first part of the two parts is substantially equal to the distance the hole extends through a second part of the two parts.

5. The burl plate of claim 2, wherein the hole is a blind hole.

6. The burl plate of claim 1, further comprising a heater on a surface of the main body opposite to a surface on which a substrate is to be positioned, in use.

7. The burl plate of claim 6, comprising at least one further heater on the surface.

8. The burl plate of claim 7, comprising a further temperature sensing probe having a temperature sensor in an elongate housing wherein the elongate housing is elongate and comprised of a material with a thermal conductivity of at least 100 W/mK at 20° C., each of the heaters having an associated temperature sensing probe.

9. A burl plate comprising:
   a main body comprising a substrate supporting surface;
   a heater on a surface of the main body opposite the substrate supporting surface; and
   a temperature sensing probe comprising a housing elongate in a direction transverse to the substrate supporting surface and/or the surface opposite the substrate supporting surface and comprising a temperature sensor, in the housing, configured to measure an average temperature of a part of the main body between the substrate supporting surface and the surface opposite the substrate supporting surface.

10. The burl plate of claim 9, wherein the elongated housing is comprised of a material with a thermal conductivity of at least 100 W/mK at 20° C.

11. A lithographic apparatus comprising:
    a system to impart a pattern on a substrate;
    a burl plate comprising a main body, the main body comprising an object supporting surface; and
    a temperature sensing probe, comprising a temperature sensor in an elongate housing, wherein the elongate housing is elongate in a first direction transverse to the object supporting surface, contacts the main body along at least part of its length, and is comprised of a material with a thermal conductivity of at least 100 W/mK at 20° C. in at least one direction.

12. A method of compensating for a local heat load in an immersion lithographic projection apparatus, the method comprising:
    measuring an average temperature of a part of a main body of a burl plate between a substrate supporting surface of the main body and a surface opposite the substrate supporting surface, using a temperature sensing probe comprising a housing elongate in a direction transverse to the substrate supporting surface and/or the surface opposite the substrate supporting surface and comprising a temperature sensor in the housing; and
    controlling a heater on the surface of the main body opposite the substrate supporting surface based on a signal indicative of the average temperature.

13. The burl plate of claim 9, wherein the sensor is inserted in a hole in the main body to measure an average temperature of the surface of the hole.

14. The lithographic apparatus of claim 11, wherein the sensor is inserted in a hole in the main body to measure an average temperature of the surface of the hole.

15. A burl plate system for a lithographic apparatus, the burl plate system comprising:
    a main body; and
    a temperature sensing probe comprising a temperature sensor in a housing, wherein the housing is elongate, contacts the main body along at least part of its length, and is comprised of a material with a thermal conductivity of at least 100 W/mK at 20° C., and wherein the temperature sensor is shorter than the length of the elongate housing.

16. The burl plate system of claim 15, wherein the sensor is inserted in a hole in the main body to measure an average temperature of the surface of the hole.

17. The burl plate system of claim 16, wherein the hole is a blind hole.

18. The burl plate system of claim 15, wherein the housing is elongate in a direction transverse to an object supporting surface of the main body and/or a surface of the main body opposite the object supporting surface.

19. The burl plate system of claim 15, wherein the temperature sensor is substantially at a center of the elongate housing.

20. The burl plate system of claim 15, further comprising a system of a lithographic apparatus to impart a pattern on a substrate.

* * * * *